US010347677B2

(12) United States Patent
Crocherie et al.

(10) Patent No.: US 10,347,677 B2
(45) Date of Patent: Jul. 9, 2019

(54) IMAGE SENSOR WITH IMPROVED QUANTUM EFFICIENCY FOR INFRARED RADIATION

(71) Applicant: STMicroelectronics (Crolles 2) SAS, Crolles (FR)

(72) Inventors: Axel Crocherie, Grenoble (FR); Pierre Emmanuel Marie Malinge, La Tessoualle (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 4 days.

(21) Appl. No.: 15/460,992

(22) Filed: Mar. 16, 2017

(65) Prior Publication Data

US 2018/0083057 A1 Mar. 22, 2018

(30) Foreign Application Priority Data

Sep. 22, 2016 (FR) .................................... 16 58898

(51) Int. Cl.
    *H01L 27/146* (2006.01)
(52) U.S. Cl.
    CPC .... *H01L 27/14625* (2013.01); *H01L 27/1463* (2013.01); *H01L 27/1464* (2013.01); *H01L 27/14627* (2013.01); *H01L 27/14629* (2013.01); *H01L 27/14636* (2013.01); *H01L 27/14649* (2013.01); *H01L 27/14685* (2013.01)

(58) Field of Classification Search
    CPC ......... H01L 27/14625; H01L 27/14627; H01L 27/14629
    See application file for complete search history.

(56) References Cited

U.S. PATENT DOCUMENTS

| 2011/0164156 | A1  | 7/2011  | Hiramoto et al. |
| 2013/0134535 | A1* | 5/2013  | Lenchenkov ..... H01L 27/14627 257/432 |
| 2015/0323800 | A1  | 11/2015 | Nam et al. |
| 2016/0112614 | A1  | 4/2016  | Masuda et al. |

FOREIGN PATENT DOCUMENTS

EP          2320463 A1   5/2011

OTHER PUBLICATIONS

INPI Search Report and Written Opinion for FR 1658898 dated Jun. 7, 2017 (8 pages).

* cited by examiner

*Primary Examiner* — Errol V Fernandes
(74) *Attorney, Agent, or Firm* — Crowe & Dunlevy

(57) ABSTRACT

An integrated image sensor with backside illumination includes a pixel. The pixel is formed by a photodiode within an active semiconductor region having a first face and a second face. A converging lens, lying in front of the first face of the active region, directs received light rays towards a central zone of the active region. At least one diffracting element, having a refractive index different from a refractive index of the active region, is provided at least partly aligned with the central zone at one of the first and second faces.

21 Claims, 3 Drawing Sheets

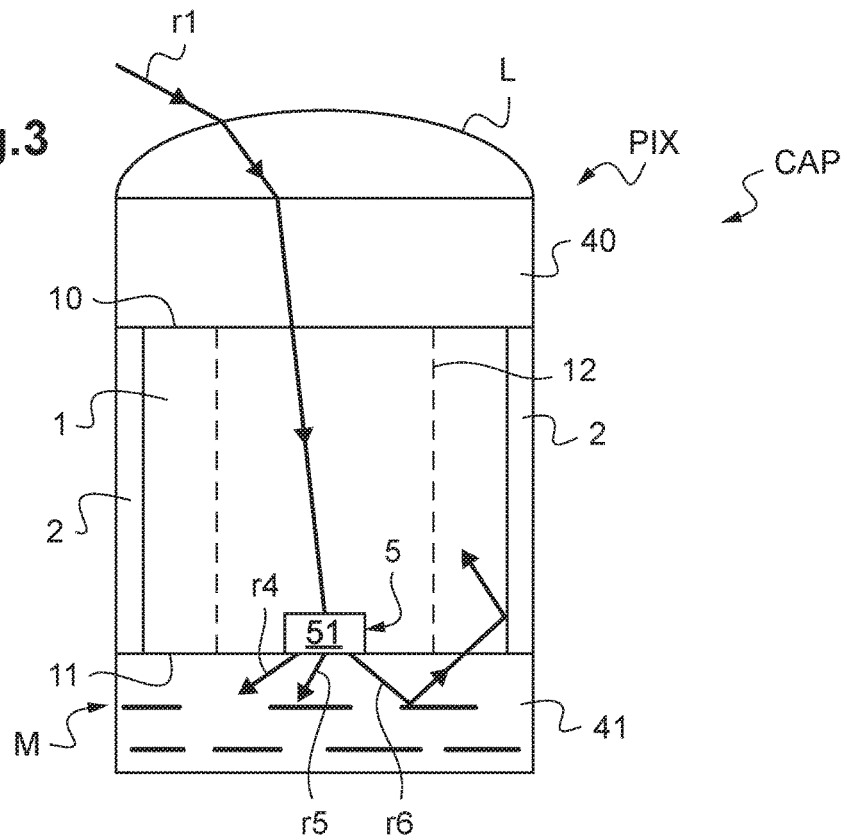
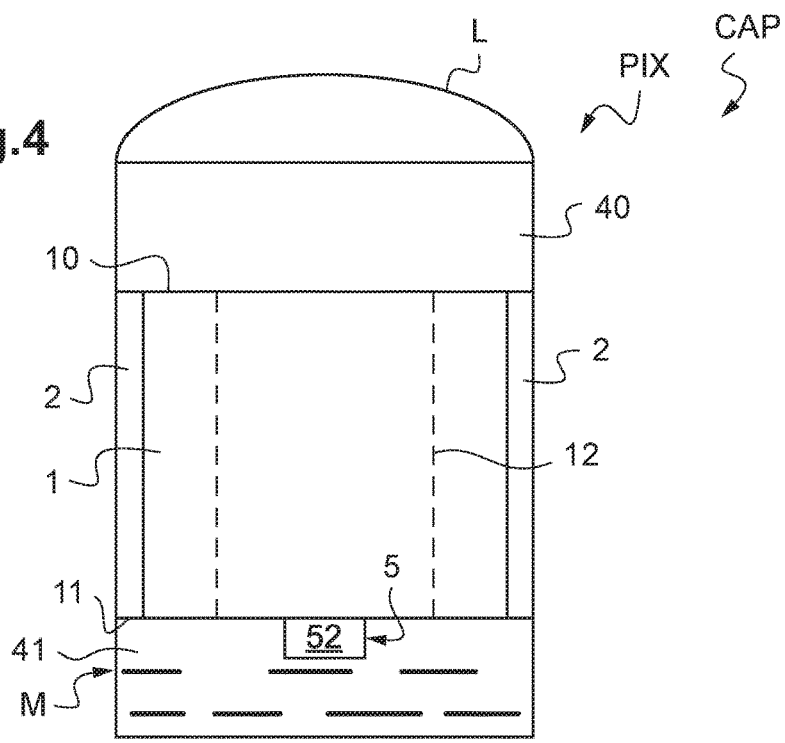

IMAGE SENSOR WITH IMPROVED QUANTUM EFFICIENCY FOR INFRARED RADIATION

PRIORITY CLAIM

This application claims the priority benefit of French Application for Patent No. 1658898, filed on Sep. 22, 2016, the disclosure of which is hereby incorporated by reference in its entirety.

TECHNICAL FIELD

Embodiments relate to optical image sensors, in particular image sensors with backside illumination, and in particular to improvement of the quantum efficiency of this type of sensor.

BACKGROUND

The quantum efficiency of an image sensor is the ratio between the number of electronic charges collected and the number of photons incident on an active region of an image sensor, for example a photodiode. This quantity makes it possible to characterize the sensitivity of an image sensor to light.

The quantum efficiency for near-infrared optical signals, i.e. light rays whose wavelength lies between 700 nanometers and 1000 nanometers, is low, specifically because of the low absorption of these wavelengths by the silicon of the photosensitive regions of the sensors.

There are means which make it possible to improve the quantum efficiency of image sensors with backside illumination for near-infrared wavelengths.

One solution consists in increasing the optical path traveled by the light rays in the silicon by reflection phenomena, for example on metallization levels lying in the interconnection part (commonly referred to by the person skilled in the art by the acronym BEOL: "Back End Of Line") behind the active zone, or on insulating trenches which delimit the active zone.

These methods, however, remain insufficient, particularly because of the small silicon thicknesses which are used in the most compact image sensors.

There is accordingly a need in the art to provide an image sensor having an improved quantum efficiency for infrared light rays.

SUMMARY

One aspect provides an integrated image sensor with backside illumination, comprising at least one pixel comprising an active semiconductor region having a first face or rear face and a second face and containing a photodiode, and a converging lens which lies in front of the first face of the active region and is configured in order to direct the light rays arriving on the lens towards a central zone of the active region.

According to one general characteristic of this aspect, the active region comprises at least one diffracting element which has a refractive index different from the refractive index of the active region (for example, an oxide) and lies at least partly in the central zone, on one of the faces of the active region.

Thus, by forming a specific diffracting element at least partly in the central zone, the optical path traveled by the light rays in the silicon is increased even further because of the numerous diffractions resulting from the positioning of this diffracting element.

The sensor may furthermore comprise at least one metallization level which lies in front of the second face of the active region, is encapsulated in an insulating region and is optically coupled to the diffracting element.

Thus, the effect of the diffracting element is increased even further by the presence of at least one metallization level, which reflects the rays diffracted by the diffracting element.

According to one embodiment, the at least one diffracting element may contain a trench of insulating material lying in the active region on the first face of the active region.

According to another embodiment, which is compatible with the preceding embodiment, the at least one diffracting element may contain a trench of insulating material lying in the active region on the second face of the active region.

The at least one diffracting element may also comprise a line of polysilicon formed on the second face of the active region. Since the front face of the active region conventionally contains a thin protective layer of oxide, there is always a difference in index between the diffracting element and its immediate environment.

According to one embodiment, the at least one diffracting element extends along a single direction parallel to the first face and the second face and lies at least partly in the central zone of the active region.

The sensor may comprise a plurality of diffracting elements, of which at least one lies at least partly in the central zone of the active region.

At least some of the diffracting elements may be joined together so as to form a single diffracting pattern extending along a plurality of directions.

Another aspect provides a system, for example of the type forming a smartphone or a digital camera, comprising at least one integrated image sensor as defined above.

BRIEF DESCRIPTION OF THE DRAWINGS

Other advantages and characteristics of the invention will become apparent on studying the detailed description of entirely non-limiting embodiments and the appended drawings, in which:

FIG. 3 is a cross-sectional view of a pixel of an integrated image sensor of the type with backside illumination and a front side diffracting element;

FIG. 4 is a cross-sectional view of a pixel of an integrated image sensor of the type with backside illumination and a front side polysilicon diffracting element;

DETAILED DESCRIPTION

Figure 1:
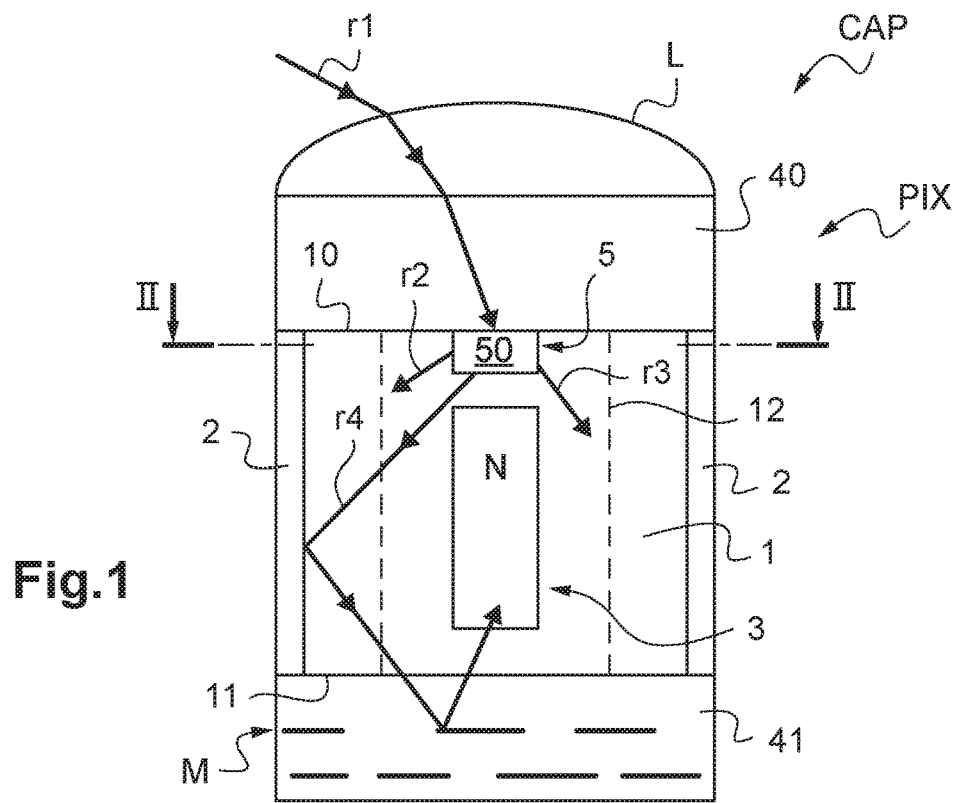
FIG. 1 is a cross-sectional view of a pixel of an integrated image sensor of the type with backside illumination and a backside diffracting element.
Figure 2:
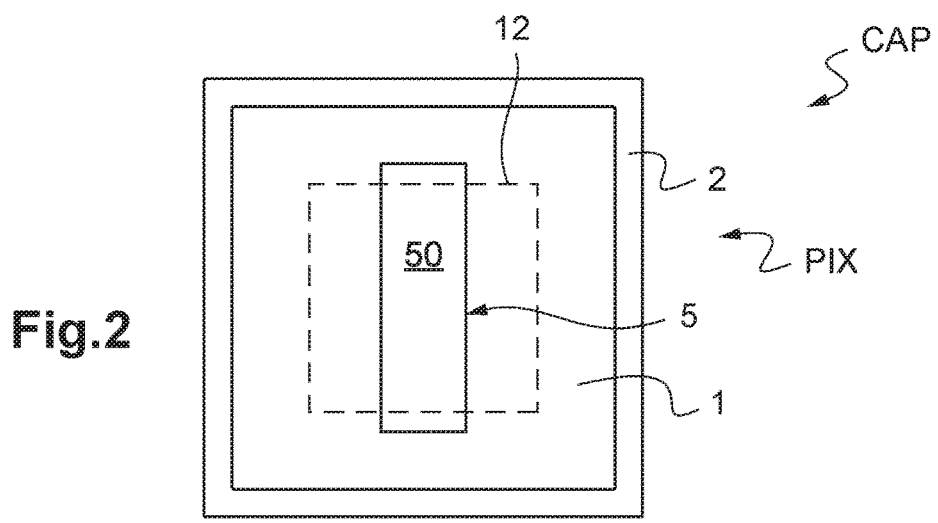
FIG. 2 is a perpendicular cross-sectional view of the pixel of FIG. 1.

FIG. 1 schematically illustrates a pixel PIX of an integrated image sensor CAP of the type with backside illumination (BSI), and FIG. 2 is a view in section along the section line II-II of FIG. 1.

The pixel PIX has an active region 1, which has a first face 10, or rear face, and a second face 11, or front face. The active region 1 is isolated from the adjacent pixels by deep isolation trenches 2 (DTI: "Deep Trench Isolation").

The active region 1 conventionally includes a photodiode 3. The photodiode 3 is in this case of the vertical "pinned" type, i.e. a photodiode having a doped region, for example of the N-type, enclosed in another doped region, for example of the P-type, and extending vertically in the active region 1, i.e. along a direction extending from the front face 10 to the rear face 11.

The pixel PIX comprises a first insulating region 40, which is formed on the rear face 10 of the active region and on which there is a converging lens L capable of converging incident rays r1 towards a central zone 12 of the active region 1, comprising the photodiode 3.

The pixel PIX comprises a second insulating region 41 enclosing a plurality of metallization levels, which belong, for example, to an interconnection part (BEOL) of the integrated circuit containing the sensor CAP. These metallization levels may make it possible to form interconnections between various components of the sensor (these are not represented for the sake of simplicity), and some metallization levels M, which lie in front of the second face of the active region, are also used as reflectors in order to reflect towards the active region 1 light rays which may possibly pass through the latter.

The rear face 10 of the active region supports a diffracting element 5, which is formed within the active region 1 and partly in the central region 12, and is capable of diffracting the incident rays coming from the lens L.

The diffracting element 5 in this case comprises a shallow trench 50, which is formed in the active region 1 and contains an insulating material.

Thus, for example, when an incident light ray r1 arrives on the lens L, it is directed towards the central zone 12 of the active region 1. When it encounters the diffracting element 5, it is diffracted into the active region 1 in a multitude of diffracted rays r2, r3, r4 at different angles.

For example, the diffracted ray r4 is reflected a first time against the deep isolation trenches 2 towards the front face 11 of the active region 1. The diffracted ray r4 then passes through the active region 1 until it encounters a metal line of the metallization level M encapsulated in the second insulating region 41. The ray is then reflected a second time towards the active region 1, in which it may be reflected again on the deep trenches 2 and/or may be absorbed.

Thus, the diffracting element 5 advantageously contributes to increasing the optical path of the incident rays passing through the lens L.

This is because the combined effects of the diffracting element 5, of the isolation trenches 2, and of the metallization level M allow a particularly long optical path, and therefore a great improvement in the absorption of the photons by the active region 1. The quantum efficiency of the image sensor CAP is therefore improved.

The inventors have, in particular, observed that this type of sensor allows up to 3 times more absorption of infrared radiation than the absorption of infrared radiation by a sensor which is similar but does not have a diffracting element.

It should be noted here that not all the incident rays encounter the diffracting element 5. Nevertheless, since the lens L is a converging lens configured in order to direct the incident rays towards the central zone 12 of the active region and the diffracting element lies partly in this central zone 12, the majority of the incident rays will encounter the diffracting element 5.

FIG. 3 illustrates an embodiment in which the diffracting element 5 contains a shallow isolation trench 51 that lies not on the rear face 10 of the sensor, as described above, but on the front face 11 in the active region.

Thus, an incident ray r1 arriving on the sensor will first pass through the active region 1 before being diffracted by the diffracting element 5. The majority of the rays r4, r5, r6 diffracted by the diffracting element 5 are therefore reflected a first time by a metal line of the metallization level M towards the active region 1, where they may be reflected a second time against the deep isolation trenches 2, and/or may be absorbed.

It is also possible for an incident ray to pass through the active region 1 and then for it to be reflected a first time by a metal line of the metallization level M towards the diffracting element, before encountering the diffracting element 5, and being diffracted into the active region 1 in a plurality of diffracted rays, which are reflected a second time against the deep isolation trenches 2 and/or may be absorbed.

This embodiment is also compatible with a pixel having a photodiode of the planar type.

It should be noted that it is entirely possible to provide a diffracting element which contains both an isolating trench lying on the rear face 10 and an isolating trench lying on the front face 11.

FIG. 4 illustrates an embodiment of the invention in which the diffracting element 5 contains a line of polysilicon 52 formed on the front face of the active region 1, between the active region 1 and the metallization level M. Since the front face 11 of the active region 1 conventionally comprises a thin protective layer of oxide, there is a difference in index between the diffracting element 5 and the front face 11.

This embodiment has the same advantages in terms of optics as the embodiment described above and illustrated in FIG. 2, and could be combined with the embodiments illustrated in FIGS. 2 and/or 3.

This embodiment of FIG. 4 is, however, particularly advantageous in terms of the production method. This is because the line of polysilicon material 52 is formed according to the same method used to form elements of other electronic components, for example charge transfer gates involved in the operation of the pixel (not shown for the sake of simplicity). This line of polysilicon is therefore a "dummy gate", which is a term well known by the person skilled in the art.

Figure 5:
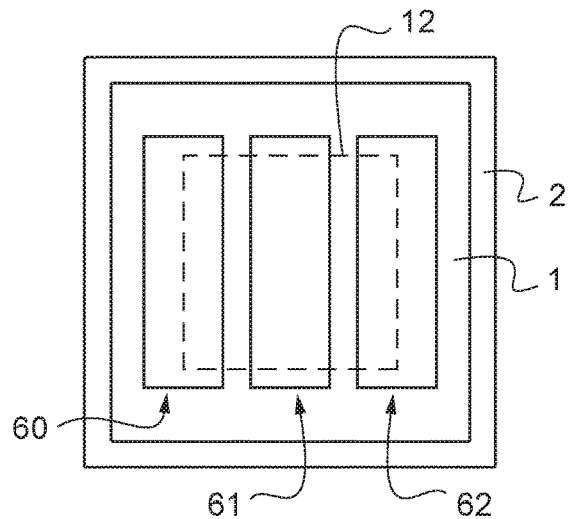
FIG. 5 is a perpendicular cross-sectional view of a pixel embodiment.

Although image sensors having pixels comprising a single diffracting element have been presented here, it would also be conceivable, as illustrated in FIG. 5, to form a plurality of diffracting elements 60, 61, 62 in the active region 1 according to one of the embodiments presented above and illustrated in FIGS. 1 to 4.

In view of the fact that the majority of the light rays arrive in the central zone 12, at least one of the diffracting elements, here the element 61, lies partly in the central region 12. The other two diffracting elements 60 and 62 are formed parallel on either side of the diffracting element 61.

The image sensors CAP described above and illustrated in FIGS. 1 to 5 may be integrated in a conventional way into an optical system comprising a shutter, conventionally in a digital camera or in a smartphone.

Figure 6:
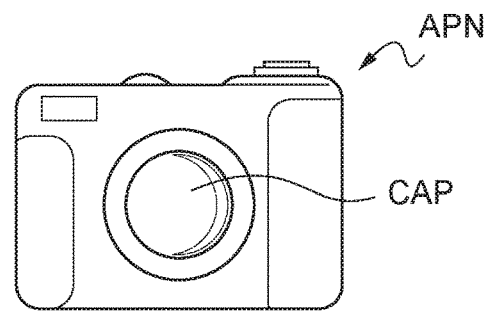
FIGS. 6 and 7 illustrate systems containing image sensors.
Figure 7:
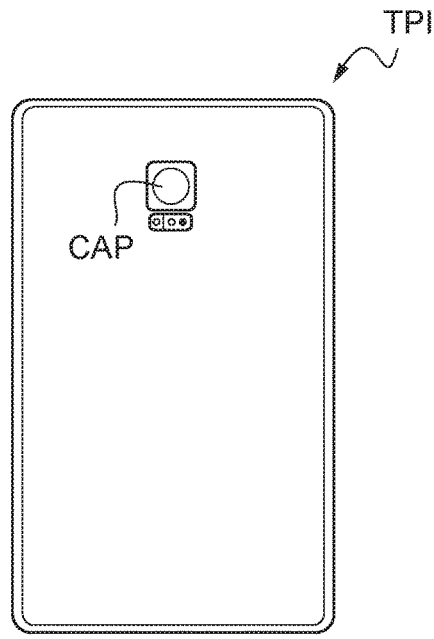

FIGS. 6 and 7 illustrate systems containing image sensors CAP having pixels PIX according to one embodiment. FIG. 6 illustrates a digital camera APN and FIG. 7 illustrates a mobile smartphone TPI. The camera and the mobile smartphone contain an image sensor CAP according to one embodiment disclosed herein.

The examples of application of the image sensor are not limited to those illustrated in FIGS. 6 and 7, and the person skilled in the art will know how to apply the embodiments of the image sensor described above and illustrated in FIGS. 1 to 5 to other known systems.

The embodiments presented here are in no way limiting. In particular, although an image sensor having a plurality of parallel separate diffracting elements 60, 61, 62 has been presented here in connection with FIG. 5, it would be entirely conceivable to have a plurality of diffracting elements extending along different directions, and/or being joined together so as to form only a single pattern.

The invention claimed is:

1. An integrated image sensor with backside illumination including at least one pixel, comprising:
    an active semiconductor region having a flat first face and a flat second face and containing a photodiode within a central zone of the active semiconductor region, and
    a converging lens which lies in front of the flat first face of the active semiconductor region and is configured in order to direct light rays arriving on the converging lens towards the central zone of the active semiconductor region,
    wherein the active semiconductor region comprises at least one diffracting element located within the active semiconductor region at one of the flat first and second faces, said at least one diffracting element formed by a trench extending into the active semiconductor region from the at one of the flat first and second faces, said trench being filled with a material having a refractive index different from a refractive index of the active semiconductor region, said trench being positioned in alignment with the central zone.

2. The sensor according to claim 1, further comprising at least one metallization level which lies in front of the flat second face of the active semiconductor region, is encapsulated in an insulating region and is optically coupled to the at least one diffracting element.

3. The sensor according to claim 1, wherein the material filling the trench is an insulating material and wherein a surface of the filled trench is coplanar with the flat first face of the active semiconductor region.

4. The sensor according to claim 1, wherein the material filling the trench is filled with an insulating material, and wherein a surface of the filled trench is coplanar with the flat second face of the active semiconductor region.

5. The sensor according to claim 1, wherein the at least one diffracting element extends along a single direction parallel to the flat first face and to the flat second face and lies at least partly outside the central zone of the active semiconductor region.

6. The sensor according to claim 1, comprising a plurality of diffracting elements, of which at least one lies at least partly outside the central zone of the active semiconductor region.

7. The sensor according to claim 6, wherein at least some of the plurality of diffracting elements are joined together so as to form a single diffracting pattern extending along a plurality of directions.

8. A system, comprising an integrated image sensor, said integrated image sensor including at least one pixel comprising:
    an active semiconductor region having a flat first face and a flat second face and containing a photodiode within a central zone of the active semiconductor region,
    a converging lens mounted adjacent the flat first face of the active semiconductor region and configured to direct light rays arriving on the converging lens towards the central zone of the active semiconductor region, and
    a plurality of metallization levels mounted adjacent the flat second face of the active semiconductor region,
    wherein the active semiconductor region comprises at least one diffracting element located within the active semiconductor region at the flat second face, said at least one diffracting element formed by a trench extending into the active semiconductor region from the flat second face, said trench being filled with a material having a refractive index different from a refractive index of the active semiconductor region, said trench being positioned in alignment with the central zone.

9. The system according to claim 8, wherein the system is one of a smartphone or a digital camera.

10. The system according to claim 8, wherein the material filling the trench is an insulating material.

11. The system according to claim 8, wherein said plurality of metallization levels include a metal element configured to reflect light received from the diffracting element towards the photodiode.

12. The system according to claim 8, wherein a surface of the filled trench and said flat second face are coplanar.

13. An image sensing pixel, comprising:
    a semiconductor substrate having a first face and a second face opposite the first face;
    an active semiconductor region of said semiconductor substrate that is delimited by deep trench isolations that extend through the semiconductor substrate from the first face to the second face;
    a photodiode within the active semiconductor region;
    a converging lens mounted at the first face and configured to direct received light towards the first face;
    a plurality of metallization levels mounted at the second face; and
    wherein the semiconductor substrate includes a trench located at the second face in the active semiconductor region, said trench filled with an insulating material to form a diffracting element configured to diffract light received from the converging lens in directions for reflection by both at least one of the metallization levels and sidewalls of the deep trench isolations.

14. The image sensing pixel of claim 13, wherein the plurality of metallization levels include a metal element configured to reflect diffracted light received from the diffracting element towards the photodiode.

15. An integrated image sensor with backside illumination including at least one pixel, comprising:
    a semiconductor substrate having a first face and a second face opposite the first face and including an active semiconductor region with a photodiode, wherein the active semiconductor region is delimited by deep trench isolations that extend through the semiconductor substrate from the first face to the second face, and
    a converging lens adjacent the first face and configured to direct the light rays arriving on the converging lens through the first face and towards the active semiconductor region,
    at least one diffracting element comprising a trench located in at least one of the first and second faces which is filled with an insulating material having a refractive index different from a refractive index of the semiconductor substrate, wherein the at least one diffracting element is configured to diffract light received from the converging lens in directions for reflection by both at least one of the metallization levels and sidewalls of the deep trench isolations.

16. The sensor according to claim 15, further comprising at least one metallization level adjacent the second face of the active semiconductor region.

17. The sensor according to claim 15, wherein the trench filled with the insulating material extends into the semiconductor substrate from the first face.

18. The sensor according to claim 15, wherein the trench filled with the insulating material extends into the semiconductor substrate from the second face.

19. The sensor according to claim 15, wherein the at least one diffracting element extends along a single direction parallel to the one of the first and second faces.

20. The sensor according to claim 15, wherein the at least one diffracting element comprises a plurality of diffracting elements.

21. The sensor according to claim 20, wherein at least some of the plurality of diffracting elements are joined together so as to form a single diffracting pattern extending along a plurality of directions.

\* \* \* \* \*